(12) United States Patent
Mori

(10) Patent No.: US 11,791,244 B2
(45) Date of Patent: Oct. 17, 2023

(54) SEMICONDUCTOR-MODULE EXTERNAL TERMINAL

(71) Applicant: Sansha Electric Manufacturing Co., Ltd., Osaka (JP)

(72) Inventor: Hiroko Mori, Osaka (JP)

(73) Assignee: SANSHA ELECTRIC MANUFACTURING CO., LTD., Osaka (JP)

( * ) Notice: Subject to any disclaimer, the term of this patent is extended or adjusted under 35 U.S.C. 154(b) by 122 days.

(21) Appl. No.: 17/603,254

(22) PCT Filed: Dec. 23, 2019

(86) PCT No.: PCT/JP2019/050285
§ 371 (c)(1),
(2) Date: Oct. 12, 2021

(87) PCT Pub. No.: WO2020/213214
PCT Pub. Date: Oct. 22, 2020

(65) Prior Publication Data
US 2022/0199495 A1    Jun. 23, 2022

(30) Foreign Application Priority Data
Apr. 19, 2019    (JP) ................. 2019-079866

(51) Int. Cl.
*H01L 23/492*    (2006.01)
*H01R 12/55*    (2011.01)

(52) U.S. Cl.
CPC ........... *H01L 23/492* (2013.01); *H01R 12/55* (2013.01)

(58) Field of Classification Search
CPC ... H01L 23/492; H01L 23/053; H01L 23/562; H01L 25/072; H01L 23/49811; H01R 12/55; H05K 3/341; H05K 2201/1031; H05K 2201/10818; Y02P 70/50
See application file for complete search history.

(56) References Cited

U.S. PATENT DOCUMENTS

| 2003/0034169 A1 | 2/2003 | Tanaka |
| 2005/0009416 A1 | 1/2005 | Tanaka |
| 2007/0134976 A1* | 6/2007 | Fujimoto .............. H01L 25/072 439/495 |

(Continued)

FOREIGN PATENT DOCUMENTS

| JP | S59-110146 A | 6/1984 |
| JP | S63-164242 U | 10/1988 |

(Continued)

OTHER PUBLICATIONS

International Search Report for corresponding Application No. PCT/JP2019/050285, dated Mar. 3, 2020.

*Primary Examiner* — Elias Ullah
(74) *Attorney, Agent, or Firm* — Renner, Otto, Boisselle & Sklar, LLP

(57) ABSTRACT

A semiconductor-module external terminal includes a bottom portion to be soldered and a terminal body vertically bent from the bottom portion, and the terminal body includes a first groove on a left end side and a second groove on a right end side of a bending portion which is bent immediately above the bottom portion, and the first groove and the second groove are asymmetrical with respect to a center line passing the terminal body in a vertical direction.

7 Claims, 5 Drawing Sheets

(56) References Cited

U.S. PATENT DOCUMENTS

| | | | |
|---|---|---|---|
| 2015/0061098 | A1 | 3/2015 | Imoto |
| 2015/0364847 | A1* | 12/2015 | Yao ..................... H01R 12/585 |
| | | | 439/869 |
| 2018/0122723 | A1 | 5/2018 | Kodaira |
| 2018/0374817 | A1 | 12/2018 | Eguchi |

FOREIGN PATENT DOCUMENTS

| | | | |
|---|---|---|---|
| JP | H06-021603 | A | 1/1994 |
| JP | 2720009 | B2 | 2/1998 |
| JP | 2003-115337 | A | 4/2003 |
| JP | 2007-073782 | A | 3/2007 |
| JP | 2008-205329 | A | 9/2008 |
| JP | 2013-140862 | A | 7/2013 |
| JP | 2013187437 | A | 9/2013 |
| JP | 2015-046416 | A | 3/2015 |
| JP | 2015-201505 | A | 11/2015 |
| JP | 5885545 | B2 | 3/2016 |
| JP | 2019-009183 | A | 1/2019 |
| WO | 2017/122471 | A1 | 7/2017 |

\* cited by examiner

SEMICONDUCTOR-MODULE EXTERNAL TERMINAL

TECHNICAL FIELD

The present invention relates to an external terminal to be used for a semiconductor module, and more particularly to an external terminal suitable for a high-power semiconductor module.

BACKGROUND ART

In the high-power semiconductor module, thermal stress (bending stress and shear stress) causes a problem such as solder peeling and cracking when stress is applied to a substrate due to the temperature rise of the substrate. In particular, in a case in which an external terminal is soldered in a longer direction of a rectangular-shaped substrate, bending in the longer direction of the substrate is more likely to occur, which may easily cause a solder crack at a bottom portion to which the external terminal is soldered. In addition, the terminal body of the external terminal is fixed with a sealing material such as an epoxy resin with a small thermal expansion coefficient, so that a soldered portion located at the bottom portion of the external terminal is subjected to uneven stress due to a difference in thermal expansion of the sealing material and is also susceptible to thermal stress.

In other words, in order to ensure the reliability of the high-power semiconductor module, the distribution of the thermal stress that occurs in the soldered portion of the external terminal is a problem.

In order to solve the problem, conventionally, a structure in which a slit is provided in a terminal is proposed (Patent Literature 1). In this terminal, when thermal stress is applied from the substrate to the soldered portion, the slit bends to relieve stress.

CITATION LIST

Patent Literature

Patent Literature 1: Japanese Unexamined Patent Application Publication No. H6-021603

SUMMARY OF INVENTION

Technical Problem

However, the terminal shown in Patent Literature 1 does not provide sufficient stress relief when the distribution of the thermal stress from the substrate 3 changes in a complex manner. The reason for this is that the bending strength and the shear strength on left and right of the terminal body are the same, and thus the stress diffused from the bottom portion to be soldered to the substrate, to the terminal body, is unable to be effectively absorbed, thereby preventing the terminal body from deforming.

Solution to Problem

It is an object of the present invention to provide a semiconductor-module external terminal that causes a terminal body to easily deform by changing bending strength and shear strength on the left and right of the terminal body.

A semiconductor-module external terminal of the present invention includes a bottom portion to be soldered and a plate-shaped terminal body vertically bent from the bottom portion.

The terminal body includes a first groove on a left end side and a second groove on a right end side of a bending portion which is bent immediately above the bottom portion, and the first groove and the second groove are asymmetrical with respect to a center line passing the terminal body in a vertical direction.

In an embodiment of the present invention, the first groove and the second groove each have different lengths in a horizontal direction.

Other embodiments of the present invention include a third groove and a fourth groove. The third groove and the fourth groove are also asymmetrical with respect to the center line passing the terminal body in the vertical direction.

Advantageous Effects of Invention

In the present invention, the first groove and the second groove are provided on the bending portion bent immediately above the bottom portion to be soldered, so that stress concentrated on the bottom portion is affected by the first groove and the second groove, which causing the terminal body to easily deform. In addition, the first groove and the second groove are asymmetrical with respect to the center line passing through the terminal body in the vertical direction, which causes the terminal body to even more easily deform in response to stress. As a result, the stress concentrated on the bottom portion is absorbed by the deformation of the terminal body, which can prevent a solder fracture and a crack at the bottom portion from occurring.

DESCRIPTION OF EMBODIMENTS

Figure 1:
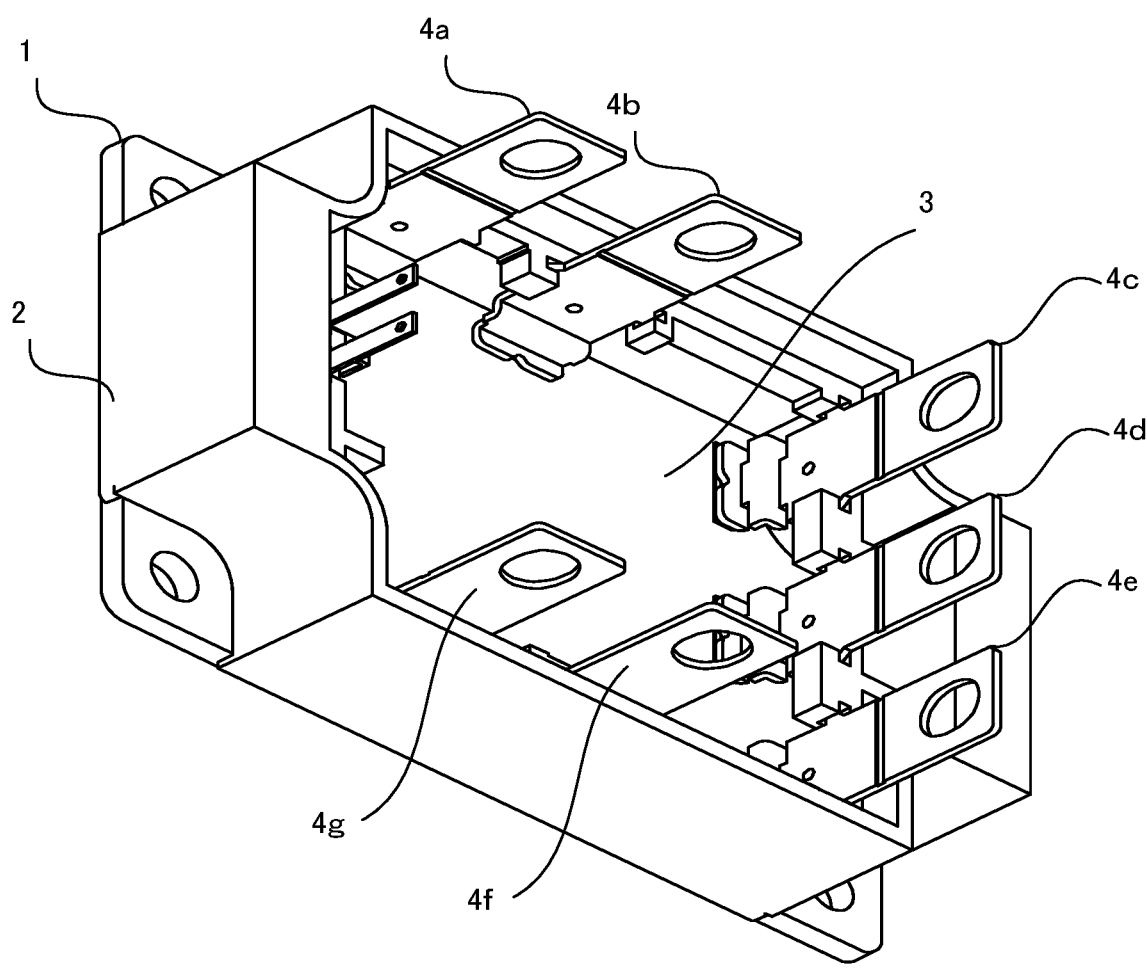
FIG. 1 is a perspective view of a semiconductor module according to an embodiment of the present invention.
Figure 2:
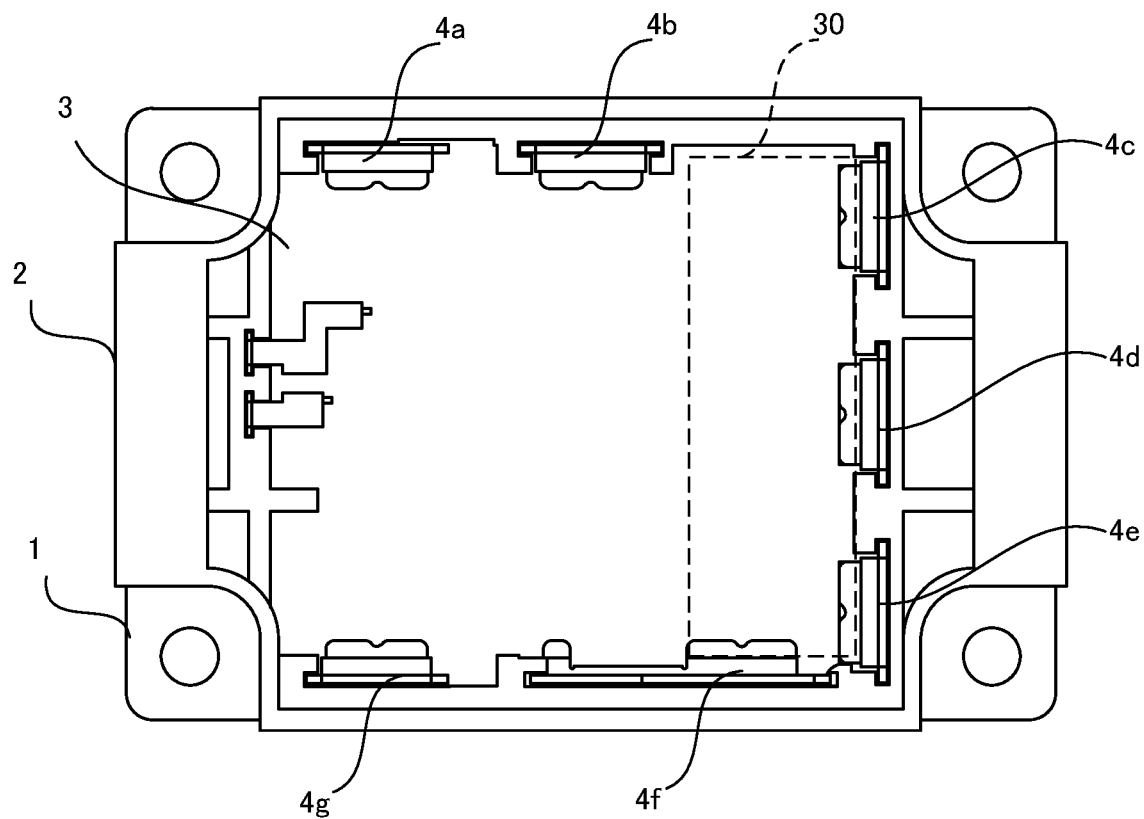
FIG. 2 is a top view of the semiconductor module.

FIG. 1 is a perspective view of a semiconductor module according to an embodiment of the present invention. FIG. 2 is a top view of the semiconductor module.

This semiconductor module includes a base plate 1 of a metal conductor, a case 2 made of a resin that is attached on the base plate 1, and a ceramic substrate (hereinafter referred to as a substrate) 3 stored in the case 2.

A plurality of semiconductor elements, circuit components, and the like that are not shown, are mounted to the substrate 3, and seven external terminals 4 (4a to 4g) for external connection are solder-connected to the upper and lower ends and the right side end of the substrate 3. Actually, the substrate 3 is configured by a DCB (Direct Copper Bond) substrate in which a plurality of ceramic substrates are directly bonded to a copper plate, and the three external terminals 4c to 4e located on the right side of FIG. 2 are disposed in a line in the longer direction of the rectangular DCB substrate 30. The other external terminals 4a, 4b, 4f, and 4g are disposed in a shorter direction of other not-shown DCB substrates.

All the seven external terminals 4 (4a to 4g) have the same shape and are each provided by punching a plate-shaped metal conductor into a predetermined shape and then performing bending. In FIG. 1 and FIG. 2, the upper end portions of the seven external terminals 4 (4a to 4g), although being not bent, are bent after the bottom portion is soldered and the inside of the case is sealed with a resin. Hereinafter, the external terminal 4 (4a to 4g) is referred to as an external terminal 4, and will be described as a single external terminal 4.

Figure 3:
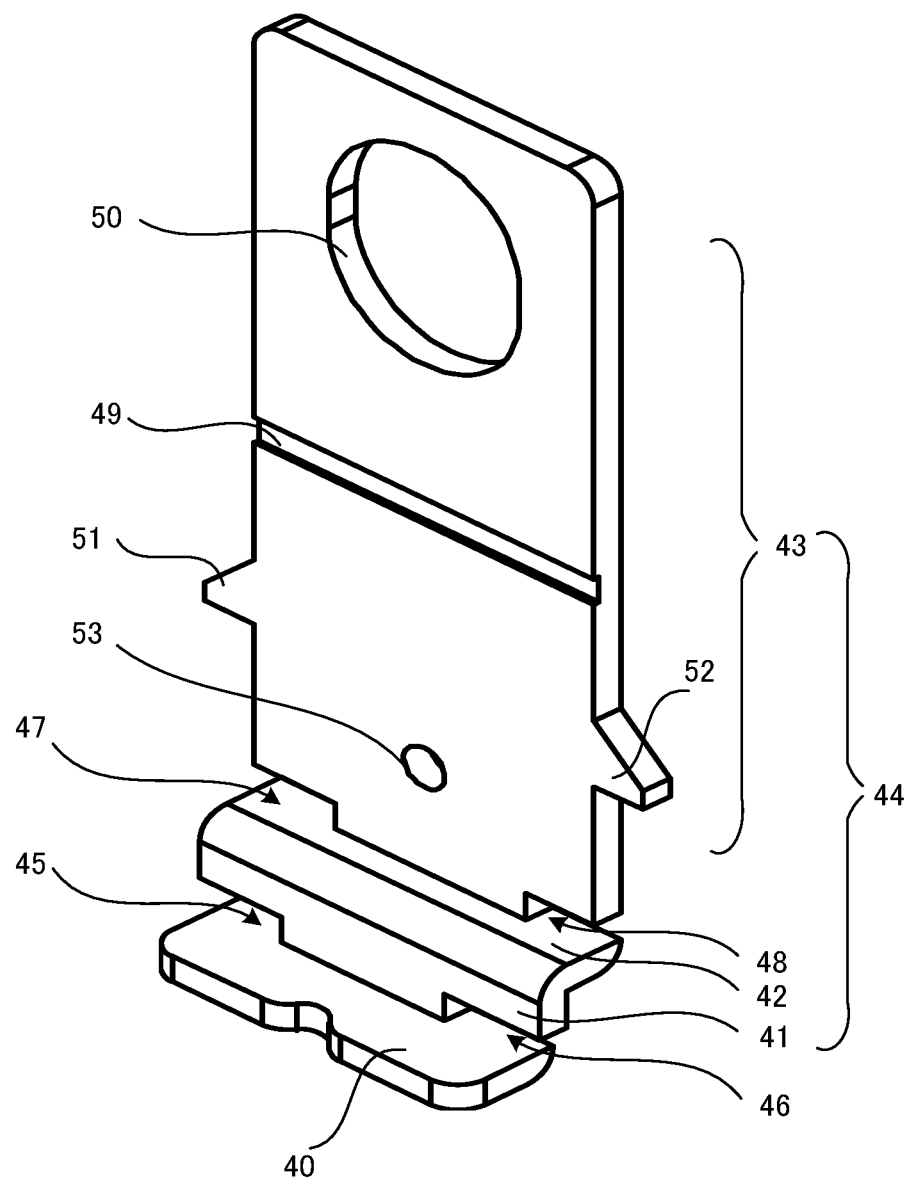
FIG. 3 is a left perspective view of an external terminal 4.
Figure 4:
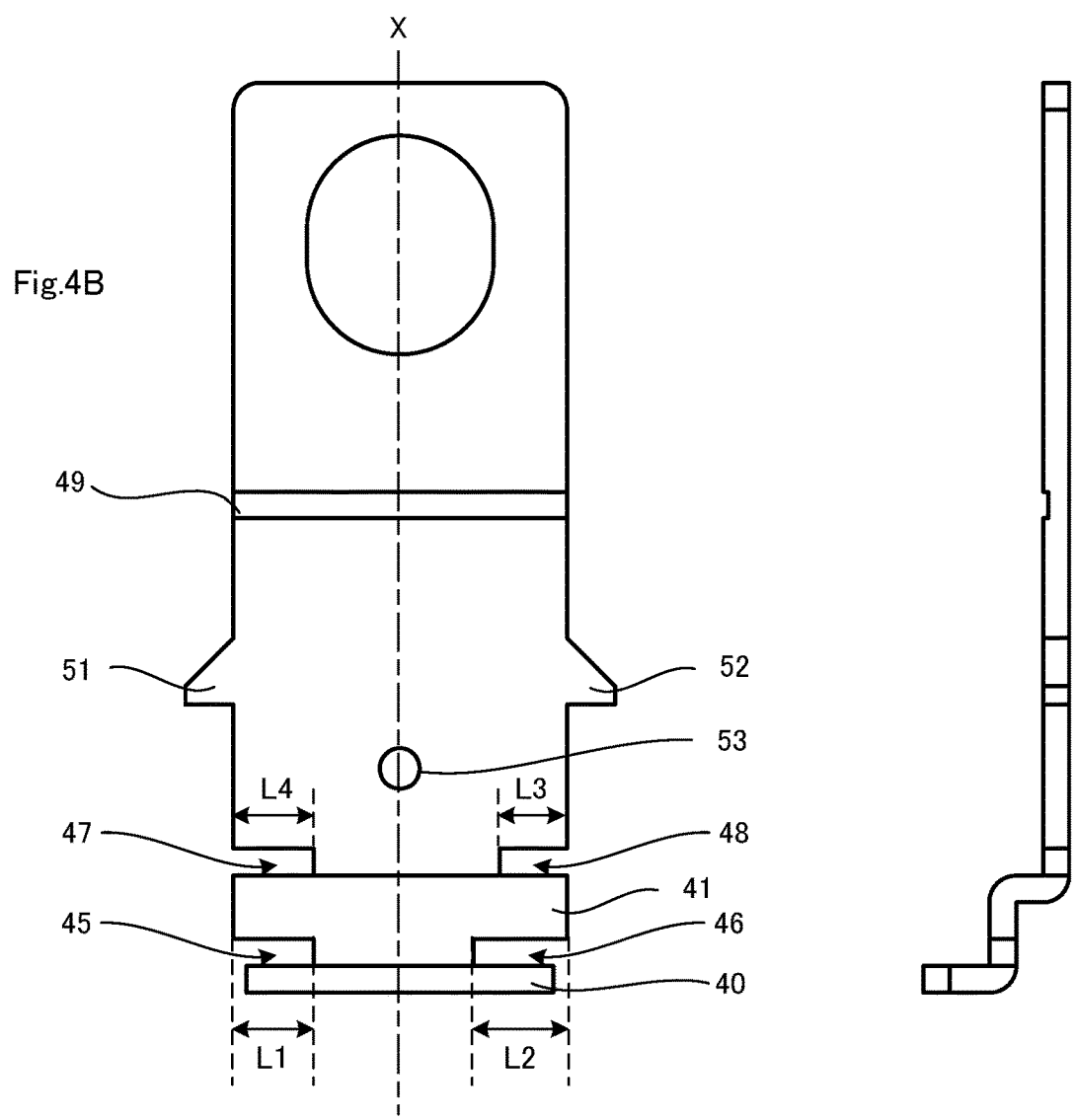
FIG. 4A is a top view of the external terminal 4.
FIG. 4B is a front view of the external terminal 4.
FIG. 4C is a bottom view of the external terminal 4.
FIG. 4D is a right side view of the external terminal 4.

FIG. 3 is a left perspective view of the external terminal 4.

The external terminal 4 is configured by a bottom portion 40 that is soldered to the substrate 3, a first vertical piece 41 bent from the bottom portion 40 in a vertical direction, a horizontal piece 42 bent from the vertical piece 41 in a horizontal direction, and a second vertical piece 43 bent from the horizontal piece 42 in the vertical direction. The first vertical piece 41, the horizontal piece 42, and the second vertical piece 43 configure a terminal body 44.

A first groove 45 on a left end side and a second groove on a right end side of a bending portion which is bent immediately above the bottom portion 40, are provided at the first vertical piece 41 of the terminal body 44. In addition, a third groove 47 on the left end side and a fourth groove 48 on the right end side at a lower end of the second vertical piece 43, above the first groove 45 and the second groove 46, are provided.

A bending part 49 is provided in a substantially central position of the second vertical piece 43 of the terminal body 44. A connection hole 50 for screwing a terminal to a cable or bus bar is provided in an upper portion of the terminal body 44. Positioning protrusions 51 and 52 are provided on the opposite ends of the second vertical piece 43, slightly below the bending part 49 of the second vertical piece 43. A fixing anchor hole 53 is provided in a center portion of the second vertical piece 43, slightly below the positioning protrusions 51 and 52 of the second vertical piece 43. These positioning protrusions 51 and 52 are hooked on the case 2, and positioned in predetermined points of the case 2. Then, the external terminal 4 is soldered to the substrate 3. When the sealing material is injected into the case 2, the sealing material also enters the anchor hole 53, and the terminal body 44 is fixed in the sealing material.

FIG. 4A to FIG. 4D are a top view (FIG. 4A), a front view (FIG. 4B), a bottom view (FIG. 4C), and a right side view (FIG. 4D) of the external terminal 4.

The first groove 45 provided on a left end side and the second groove 46 provided on a right end side of the bending portion which is bent immediately above the bottom portion 40, are asymmetrical with respect to a center line X passing through the terminal body in the vertical direction. In other words, FIG. 4A to FIG. 4D show a length L1 of the first groove 45<a length L2 of the second groove 46.

The first groove 45 and the second groove 46 are provided immediately above the bottom portion 40, that is, in contact with the bottom portion 40, and L1<L2, so that the external terminal 4 absorbs stress in an unbalanced state to the left and right in response to thermal stress generated at the bottom portion 40. As a result, in response to the thermal stress at the bottom portion 40, the first vertical piece 41 of the external terminal 4 easily deforms to the left and right, and behaves to absorb more stress. According to an experiment, setting L1<L2 rather than setting L1=L2 caused an unbalanced state in response to the thermal stress, resulting in greater stress absorption and less solder cracks at the bottom portion 40. Further, the first groove 45 and the second groove 46 were provided immediately above the bottom portion 40, so that this effect was observed more significantly.

In the present embodiment, in order to form a further unbalanced state to the left and right to the thermal stress, the third groove 47 and the fourth groove 48 are provided. The third groove 47 and the fourth groove 48 are provided on a lower end of the second vertical piece 43, and the position is above the first groove 45 and the second groove 46. The third groove 47 is provided on a left end side of the second vertical piece 43, and the fourth groove 48 is provided on a right end side of the vertical piece 43. A length L4 of the third groove 47 is the same as the length L1 of the first groove L1. In addition, the third groove 47 and the fourth groove 48 are asymmetrical with respect to the center line X in the horizontal direction. In other words, FIG. 4A to FIG. 4D show the length L4 (=L1) of the third groove 47>a length L3 of the fourth groove 48.

The third groove 47 and the fourth groove 48 as well as the first groove 45 and the second groove 46 also form an unbalanced state in response to the thermal stress to be generated at the bottom portion 40. Therefore, the terminal body 44 of the external terminal more easily deforms to the left and right in response to the thermal stress at the bottom portion 40. Herein, even when only one pair of either a pair of the first groove 45 and the second groove 46 or a pair of the third groove 47 and the fourth groove 48 is formed, an unbalanced state in response to thermal stress is able to be formed. In addition, in a case in which both of the pair of the first groove 45 and the second groove 46, and the pair of the third groove 47 and the fourth groove 48 are provided, the length of each of those grooves is able to be set to any length that allows an unbalanced state to be formed. For example, the combination of L1>L2 and L3>L4 and the combination of L1>L2 and L3<L4 are possible. In addition, in these combinations, it is possible to set the relationship between L1 and L4 to L1 >L4 or L1<L4. In these combinations, a longer groove Lx of L1 or L2 and a longer groove Ly of L3 or L4 may be disposed on the left side with respect to the center line X or may be disposed on the right side with respect to the center line X. As another example, Lx can be disposed on the left side with respect to the center line X, and Ly can also be disposed on the right side with respect to the center line X. In either case, an unbalanced state in response to thermal stress can be formed.

In addition, the second vertical piece 43 is fixed by the sealing material, so that the third groove 47 and the fourth groove 48 behave in such a way that the terminal body 44 may deform more easily to the left and right.

According to the above configuration, even when a large thermal stress is generated at the bottom portion 40 of the external terminal 4 due to continued high temperature of the substrate 3 or repeated thermal cycling, this thermal stress is absorbed by deformation of the terminal body 44, in this example, both or one of the first vertical piece 41 and the second vertical piece 43. As a result, a crack can be prevented from being generated at a soldering portion that fixes the bottom portion 40.

The above effect can be obtained by making at least the first groove 45 and the second groove 46 asymmetrical with respect to the center line X. In addition, the same effect is significant in the external terminals 4c to 4e. The reason for this is that the external terminals 4c to 4e are disposed in a line on a side in the longer direction of the rectangular-shaped DCB substrate 30. The rectangular-shaped DCB substrate 30 tends to bend in the longer direction due to heat, and thereby the external terminals 4c to 4e are presumed to be relatively more susceptible to thermal stress than the other external terminals.

Subsequently, other embodiments will be described.

Figure 5:
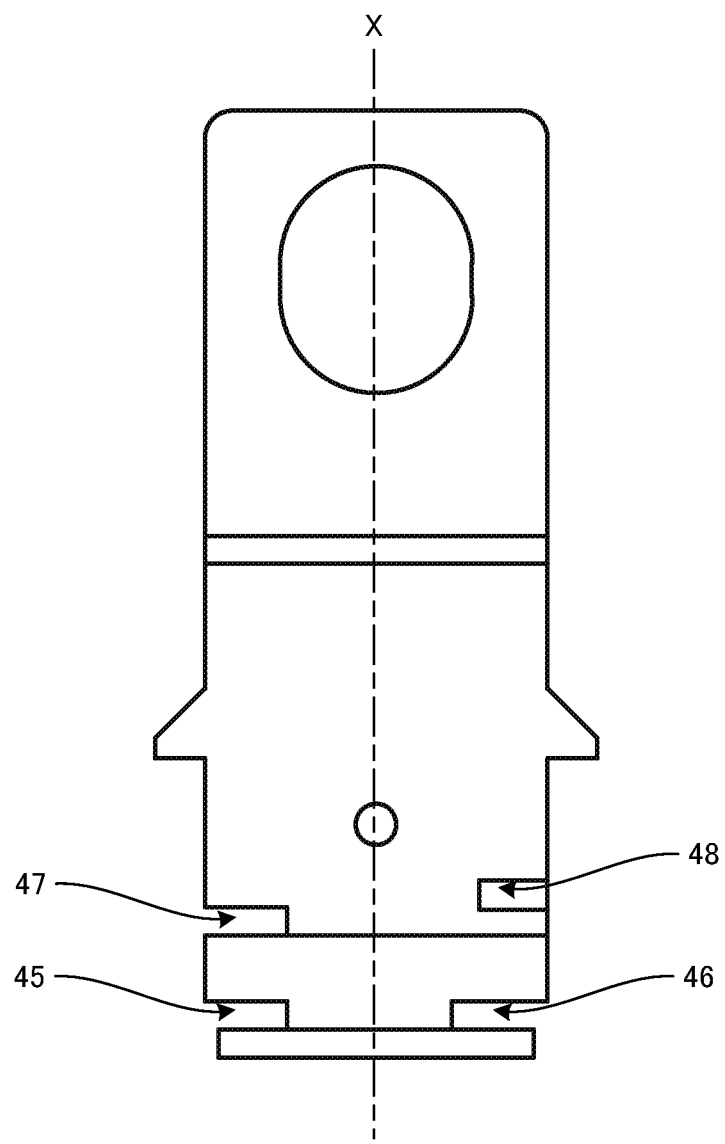
FIG. 5 is a front view of an external terminal according to a second embodiment.

FIG. 5 is a front view of an external terminal according to a second embodiment.

The third groove 47 and the fourth groove 48 are each located at different positions in the vertical direction. Others are the same as in FIG. 4A to FIG. 4D. The lengths of the third groove 47 and the fourth groove 48 may be the same or may be different.

As a result, the first groove 45 and the second groove 46 are asymmetrical with respect to the center line X, and the third groove 47 and the fourth groove 48 are also asymmetrical with respect to the center line X.

It is to be noted that the external terminal 4 is positioned at a predetermined spot inside the substrate 3 by hooking the positioning protrusions 51 and 52 on the case 2, and then the bottom portion 40 of the external terminal 4 is soldered on the substrate 3. Subsequently, the inside of the case 2 is sealed so that a soldered area may be covered with a gel-like sealing material, and then the inside of the case 2 is further sealed with an epoxy sealing material over again. At this time, the epoxy sealing material enters also into the anchor hole 53 and solidifies, and the terminal body 44 is fixed in the sealing material.

REFERENCE SIGNS LIST

1 base plate
2 case
3 substrate
4 external terminal
45 first groove
46 second groove
47 third groove
48 fourth groove
X center line

The invention claimed is:

1. A semiconductor-module external terminal that is an external terminal soldered vertically to a substrate disposed inside a semiconductor module, the semiconductor-module external terminal comprising:
   a bottom portion to be soldered; and
   a terminal body vertically bent from the bottom portion, wherein:
   the terminal body includes a first groove on a left end side and a second groove on a right end side of a bending portion which is bent immediately above the bottom portion; the first and the second grooves being notches cut from an outside of the terminal body toward a center line that passes vertically through the terminal body; and
   the first groove and the second groove are asymmetrical with respect to the center line passing the terminal body in a vertical direction.

2. The semiconductor-module external terminal according to claim 1, wherein the first groove and the second groove each have different lengths in a horizontal direction.

3. The semiconductor-module external terminal according to claim 1, wherein:
   the terminal body includes a third groove on a left end side and a fourth groove on a right end side, above the first groove and the second groove, the third and the fourth grooves being notches cut from an outside of the terminal body toward the center line that passes vertically through the terminal body; and
   the third groove and the fourth groove are asymmetrical with respect to the center line.

4. The semiconductor-module external terminal according to claim 3, wherein the third groove and the fourth groove each have different lengths in a horizontal direction.

5. The semiconductor-module external terminal according to claim 4, wherein the third groove and the fourth groove are each located at different positions in the vertical direction.

6. The semiconductor-module external terminal according to claim 3, wherein the first groove and the third groove each have different lengths in a horizontal direction.

7. The semiconductor-module external terminal according to claim 3, wherein the second groove and the fourth groove each have different lengths in a horizontal direction.

* * * * *